United States Patent
Arai et al.

(10) Patent No.: US 8,828,898 B2
(45) Date of Patent: Sep. 9, 2014

(54) GLASS PLATE AND PROCESS FOR ITS PRODUCTION

(71) Applicant: Asahi Glass Company, Limited, Chiyoda-ku (JP)

(72) Inventors: Yusuke Arai, Chiyoda-ku (JP); Tomoyuki Kobayashi, Chiyoda-ku (JP); Yuki Kondo, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 13/839,832

(22) Filed: Mar. 15, 2013

(65) Prior Publication Data

US 2013/0203584 A1 Aug. 8, 2013

Related U.S. Application Data

(63) Continuation of application No. PCT/JP2011/074724, filed on Oct. 26, 2011.

(30) Foreign Application Priority Data

Oct. 27, 2010 (JP) ................................ 2010-240978

(51) Int. Cl.
*C03C 3/085* (2006.01)
*C03C 3/087* (2006.01)
*C03C 3/078* (2006.01)

(52) U.S. Cl.
USPC ................................ 501/70; 501/69; 501/72

(58) Field of Classification Search
USPC .......................................... 501/68, 69, 70, 72
See application file for complete search history.

(56) References Cited

U.S. PATENT DOCUMENTS

| 7,141,521 | B2 * | 11/2006 | Siebers et al. | 501/32 |
| 2008/0113857 | A1 * | 5/2008 | Lee et al. | 501/72 |
| 2010/0190630 | A1 * | 7/2010 | Nishizawa et al. | 501/66 |
| 2010/0273635 | A1 * | 10/2010 | Tsuzuki et al. | 501/70 |

FOREIGN PATENT DOCUMENTS

| JP | 1-230449 | 9/1989 | |
| JP | 4-228450 | 8/1992 | |
| JP | 8-40742 | 2/1996 | |
| JP | 11-310429 | 11/1999 | |
| JP | H11-310429 A | * 11/1999 | ............. C03C 3/089 |
| JP | 2007-238398 | 9/2007 | |
| JP | 4087113 | 2/2008 | |

(Continued)

OTHER PUBLICATIONS

International Search Report issued Jan. 31, 2012 in PCT/JP2011/074724 filed Oct. 26, 2011.

(Continued)

*Primary Examiner* — Noah Wiese
(74) *Attorney, Agent, or Firm* — Oblon, Spivak, McClelland, Maier & Neustadt, L.L.P.

(57) ABSTRACT

A glass plate made of soda lime silica glass containing at least MgO, CaO, $Na_2O$ and $Al_2O_3$ produced by a float process or a downdraw method, wherein [MgO] is at least 4.5%, [MgO]/[CaO] is larger than 1, and $Q=([MgO]/[CaO])\times([CaO]+[Na_2O]-[Al_2O_3])$ is at least 20, wherein [MgO] is the content of MgO, [CaO] is the content of CaO, $[Na_2O]$ is the content of $Na_2O$, and $[Al_2O_3]$ is the content of $Al_2O_3$ (each being as represented by mass percentage based on oxide) and a process for the glass plate.

20 Claims, 2 Drawing Sheets

(56) References Cited

FOREIGN PATENT DOCUMENTS

| | | | | |
|---|---|---|---|---|
| JP | 2010-208906 | | 9/2010 | |
| WO | 01/66477 | | 9/2001 | |
| WO | WO/2009/081906 | * | 7/2009 | .............. C03C 3/085 |

OTHER PUBLICATIONS

F.N. Steele & R.W. Douglas. "Some observations on the absorption of iron in silicate and borate glasses." Dept. of Glass Technology, University of Sheffield. Physics and Chemistry of Glasses, vol. 6, No. 6, Dec. 1965, pp. 246-252.

* cited by examiner

GLASS PLATE AND PROCESS FOR ITS PRODUCTION

TECHNICAL FIELD

The present invention relates to a glass plate having a high solar transmittance and a process for its production.

BACKGROUND ART

In order for a solar cell to be able to generate electric power by light in a visible light region and a near infrared region, a glass plate for the solar cell (such as a cover glass or a glass substrate for a thin-film solar cell) is required to have sufficiently high visible light transmittance (hereinafter referred to as Tv) and solar transmittance (hereinafter referred to as Te).

Further, in solar thermal power generation wherein sunlight is collected and used as a heat source to carry out power generation, a glass plate for a light collecting mirror is required to have sufficiently high Tv and Te in order to minimize a loss of sunlight (particularly light in a near infrared region) by the light collecting mirror. This glass plate can be used as a plane plate or curved plate.

Therefore, as the glass plate for a solar cell or as the glass plate for a light collecting mirror, a high transmission glass plate (so-called white plate glass) having Tv and Te made high (e.g. Tv of at least 90%, and Te of at least 90%) by minimizing the content of a coloring component (particularly iron) is used (Patent Document 1).

Further, even a high transmission glass plate contains iron unavoidably included in its production. Therefore, in order to make Te sufficiently high in a high transmission glass plate, it becomes important to increase the proportion of trivalent iron having an absorption peak in the vicinity of a wavelength of 400 nm as much as possible and to reduce the proportion of divalent iron having an absorption peak in the wavelength region from 1,000 nm to 1,100 nm as much as possible, among the total iron contained in the high transmission glass plate (Patent Document 2).

However, such a high transmission glass plate has the following problems.

(i) In order to minimize the content of iron in the high transmission glass plate, it is necessary to minimize the content of iron in glass raw material. However, glass raw material having a minimized content of iron is expensive, and the raw material cost for the high transmission glass plate becomes high.

(ii) In order to minimize the proportion of divalent iron in the high transmission glass plate, it is necessary to lower the temperature of molten glass at the time of producing the high transmission glass plate by a float process or a downdraw method as compared with the case of producing a usual glass plate, and the productivity is poor.

Heretofore, in order to realize a high transmission glass plate, a method of adjusting the proportions of divalent iron and trivalent iron among total iron contained in the glass towards the trivalent iron side by adding a very small amount of an oxidizing agent, or a method of changing the matrix composition of the glass to move the position of absorption peak of trivalent iron, has been proposed.

For example, by incorporating from 0.025 to 0.20%, as represented by mass percentage, of cerium oxide as an oxidizing agent, the proportion of divalent iron having an absorption peak in the wavelength region from 1,000 nm to 1,100 nm is reduced among the total iron contained in the glass (Patent Document 3).

Further, it is disclosed that in a soda lime silica glass having a total amount of iron oxide calculated as ferric oxide being from 0.02 to 0.2 mass %, its matrix composition is made to comprise, as represented by mass percentage, from 69 to 75% of $SiO_2$, from 0 to 3% of $Al_2O_3$, from 0 to 5% of $B_2O_3$, from 2 to 10% of CaO, less than 2% of MgO, from 9 to 17% of $Na_2O$, from 0 to 8% of $K_2O$, optionally fluorine, zinc oxide, zirconium oxide and less than 4% of barium oxide, wherein the total of oxides of alkaline earth metals is adjusted to be at most 10%, whereby the absorption band by divalent iron is moved towards the long wavelength side, and it is possible to produce window glass which is less colored than a soda lime silica glass having a usual matrix composition and which is excellent in infrared absorption (Patent Document 4).

PRIOR ART DOCUMENTS

Patent Documents

Patent Document 1: JP-A-4-228450
Patent Document 2: JP-A-2007-238398
Patent Document 3: Japanese Patent No. 4,087,113
Patent Document 4: JP-A-8-40742

DISCLOSURE OF INVENTION

Technical Problem

By the method disclosed in Patent Document 3, it is certainly possible to increase Te by reducing the proportion of divalent iron having an absorption peak in the wavelength region from 1,000 nm to 1,100 nm among the total iron contained in the glass. However, if glass having cerium oxide added, is irradiated with ultraviolet rays as disclosed in Patent Document 3, the transmittance decreases substantially particularly from a long wavelength side of the visible region to the infrared region, and consequently, Te is adversely affected, such being undesirable. If the added amount is so small that substantially no cerium oxide is contained, this problem will not occur, but in such a case, the effect to reduce the proportion of divalent iron among the total iron contained in the glass will not be obtained substantially.

Further, by the method disclosed in Patent Document 4, it is possible to move the absorption peak in the wavelength region from 1,000 nm to 1,100 nm by the divalent iron, but there is no substantial change in the absorption quantity, and the influence to Te is very small. For example, in the case of an application wherein sunlight in the visible region to the near infrared region is desired to be fully utilized like in the case of a glass plate for a light-collecting mirror for solar thermal power generation, it is desired to establish a method to more substantially reduce the absorption peak by divalent iron.

The present invention is to solve such problems of the prior art by a method of reducing the absorption peak intensity itself in the wavelength region from 1,000 nm to 1,100 nm by divalent iron by adjusting the matrix composition of the glass.

The present invention is to provide a glass plate whereby in a case where the iron content is at the same level as a conventional glass plate, Te can be made higher than the conventional glass plate, or in a case where the iron content is larger than the conventional glass plate, Te can be made to be at the same level as the conventional glass plate, and the productivity is good; and a process for its production.

Solution To Problem

The glass plate of the present invention is a glass plate made of soda lime silica glass containing at least MgO, CaO, Na$_2$O and Al$_2$O$_3$ produced by a float process or a downdraw method, which contains at least 4.5% of MgO, as represented by mass percentage based on oxide, wherein the ratio of the content of MgO, as represented by mass percentage based on oxide, to the content of CaO, as represented by mass percentage based on oxide, ([MgO]/[CaO]), is larger than 1, and value Q obtained by the following formula (1) is at least 20:

$$Q=([MgO]/[CaO])\times([CaO]+[Na_2O]-[Al_2O_3]) \quad (1)$$

wherein [MgO] is the content of MgO, as represented by mass percentage based on oxide, [CaO] is the content of CaO, as represented by mass percentage based on oxide, [Na$_2$O] is the content of Na$_2$O, as represented by mass percentage based on oxide, [Al$_2$O$_3$] is the content of Al$_2$O$_3$, as represented by mass percentage based on oxide.

In the glass plate of the present invention, the above ratio of the content of MgO, as represented by mass percentage based on oxide, to the content of CaO, as represented by mass percentage based on oxide, ([MgO]/[CaO]), is preferably larger than 1 and not larger than 30, and the value Q obtained by the above formula (1) is preferably at least 20 and at most 400.

The glass plate of the present invention preferably has any one of the following compositions (I) to (VI):

(I) As represented by mass percentage based on oxides,
SiO$_2$: from 60 to 75%,
Al$_2$O$_3$: more than 0%,
Na$_2$O: from 10 to 20%,
MgO: at least 4.5%, and
CaO: from 1 to 10%.

(II) As represented by mass percentage based on oxides,
SiO$_2$: from 60 to 75%,
Al$_2$O$_3$: more than 0% and at most 4.5%,
Na$_2$O: from 10 to 20%,
MgO: from 4.5 to 15%,
CaO: from 1 to 10%, and
total iron calculated as Fe$_2$O$_3$: from 0 to 0.1%.

(III) As represented by mass percentage based on oxides,
SiO$_2$: from 60 to 75%,
Al$_2$O$_3$: more than 0% and at most 4.5%,
Na$_2$O: from 10 to 20%,
K$_2$O: from 0 to 5%,
MgO: from 4.5 to 10%,
CaO: from 1 to 10%, and
total iron calculated as Fe$_2$O$_3$: from 0 to 0.1%.

(IV) As represented by mass percentage based on oxides,
SiO$_2$: from 60 to 75%,
Al$_2$O$_3$: more than 0% and at most 4.5%,
Na$_2$O: from 10 to 20%,
MgO: from 4.5 to 15%,
CaO: from 1 to 10%,
ZrO$_2$: from 0 to 3%,
total iron calculated as Fe$_2$O$_3$: from 0 to 0.1%,
CeO$_2$: from 0 to 0.1%, and
Sb$_2$O$_3$: from 0 to 0.5%.

(V) as represented by mass percentage based on oxides,
SiO$_2$: from 60 to 74.5%,
Al$_2$O$_3$: from 0.5 to 3.5%,
B$_2$O$_3$: from 0 to 9%,
Na$_2$O: from 10 to 20%,
K$_2$O: from 0 to 5%,
MgO: from 4.5 to 13%,
CaO: from 1 to 10%,
total iron calculated as Fe$_2$O$_3$: from 0 to 0.1%,
CeO$_2$: from 0 to 0.05%, and
Sb$_2$O$_3$: from 0 to 0.5%.

(VI) As represented by mass percentage based on oxides,
SiO$_2$: from 60 to 74%,
Al$_2$O$_3$: from 0.5 to 2.5%,
B$_2$O$_3$: from 0 to 5%,
Na$_2$O: from 10 to 20%,
K$_2$O: from 0 to 3%,
MgO: from 4.5 to 10%,
CaO: from 1 to 10%,
total iron calculated as Fe$_2$O$_3$: from 0.005 to 0.06%,
Sb$_2$O$_3$: from 0 to 0.1%, and
ZrO$_2$: from 0 to 3%,
and which does not substantially contain CeO$_2$.

To represent the above numerical ranges, the expression "to" is used to include the numerical values presented before and after the expression as the lower limit value and the upper limit value, unless otherwise specified, and hereinafter in this specification, the expression "to" is used to have the same meaning.

In the glass plate of the present invention, it is preferred that as calculated in a thickness of 4 mm of the glass plate, the visible light transmittance (Tv) is at least 80%, and the solar transmittance (Te) is at least 80%.

The process for producing a glass plate of the present invention is a process for producing a glass plate made of soda lime silica glass containing at least MgO, CaO, Na$_2$O and Al$_2$O$_3$, which comprises melting glass raw material, followed by forming by a float process or a downdraw method, wherein the glass plate after being formed, contains at least 4.5% of MgO, as represented by mass percentage based on oxide, and wherein the ratio of the content of MgO, as represented by mass percentage based on oxide, to the content of CaO, as represented by mass percentage based on oxide, ([MgO]/[CaO]), is larger than 1, and value Q obtained by the above formula (1) is at least 20.

Advantageous Effects of Invention

Even in a case where the glass plate of the present invention is a glass plate wherein the iron content is at the same level as in a usual soda lime silica glass plate, it becomes a glass plate having a high Te at the same level as a conventional high transmission glass plate wherein the iron content is reduced. Further, in the case of a glass plate having a low iron content, it becomes a glass plate having very high Te.

According to the process for producing a glass plate of the present invention, it is possible to produce a glass plate having higher Te than a conventional glass plate from glass raw material containing iron at the same level as the conventional glass plate, or to efficiently produce a glass plate having very high Te from glass raw material having smaller iron content than the conventional glass plate.

DESCRIPTION OF EMBODIMENTS

Figure 1:
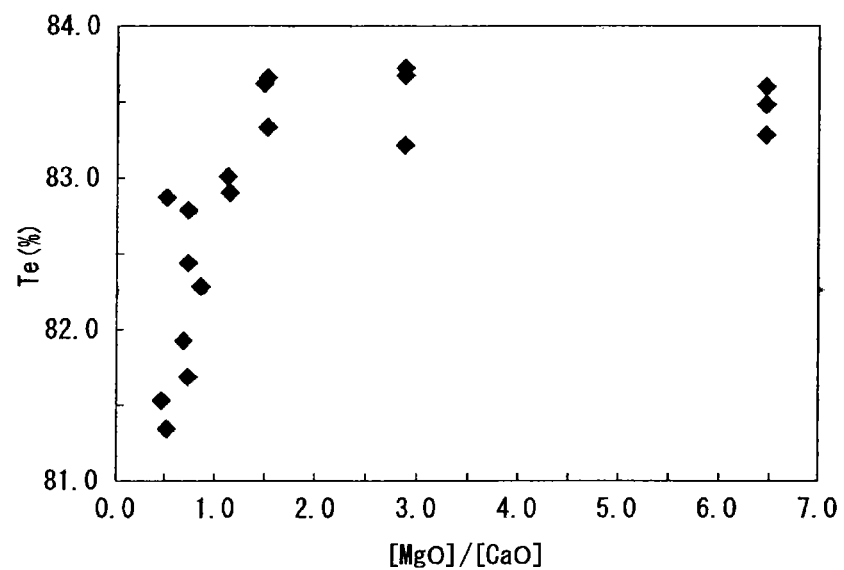
FIG. 1 is a graph showing the relation between [MgO]/[CaO] and Te in Examples 1 to 19.

The glass plate of the present invention is a glass plate produced by a float process or a downdraw method and is a glass plate different from so-called template glass produced by a roll out method.

Further, the glass plate of the present invention is one made of so-called soda lime silica glass comprising $SiO_2$ as the main component and further containing $Na_2O$, CaO, etc.

The glass plate of the present invention is a glass plate made of the soda lime silica glass containing at least MgO, CaO, $Na_2O$ and $Al_2O_3$, and it contains at least 4.5% of MgO, as represented by mass percentage based on oxide and at the same time is made to be such that the ratio of the content of MgO as represented by mass percentage based on oxide, to the content of CaO as represented by mass percentage based on oxide, ([MgO]/[CaO]), is larger than 1, i.e. the content of MgO is made larger than usual soda lime silica glass (including usual high transmission glass plate) in its absolute value and in its relative value to the content of CaO.

By making, the content of MgO to be large, the proportion of 6-coordination divalent iron having an absorption peak in the wavelength region from 1,000 nm to 1,100 nm decreases and the proportion of divalent iron not having an absorption peak in the wavelength region from 1,000 nm to 1,100 nm increases. This is considered to be one of the reasons that it is possible to obtain the same effect as in the case of having reduced the mass proportion of divalent iron calculated as $Fe_2O_3$ in the total iron calculated as $Fe_2O_3$ (hereinafter referred to as Redox). Here, Redox (%) is represented by $Fe^{2+}/(Fe^{2+}+Fe^{3+})$.

The content of MgO is, as represented by mass percentage based on oxide, at least 4.5%, preferably from 4.5 to 15%, more preferably from 4.5 to 13%, further preferably from 4.5 to 10%. If the content of MgO is too high, the devitrification temperature tends to increase.

Further, [MgO]/[CaO] is larger than 1. This [MgO]/[CaO] value is preferably at most 20. It is particularly preferably larger than 1 and not larger than 11. In a glass composition wherein the content of the total iron calculated as $Fe_2O_3$ is from 0.005 to 0.1% as represented by mass percentage based on oxide, [MgO]/[CaO] is more preferably at least 1.25 and at most 30.

In the glass plate of the present invention, the value Q obtained by the following formula (1) is at least 20.

$$Q=([MgO]/[CaO])\times([CaO]+[Na_2O]-[Al_2O_3]) \quad (1)$$

wherein [MgO] is the content of MgO, as represented by mass percentage based on oxide, [CaO] is the content of CaO, as represented by mass percentage based on oxide, [$Na_2O$] is the content of $Na_2O$, as represented by mass percentage based on oxide, and [$Al_2O_3$] is the content of $Al_2O_3$, as represented by mass percentage based on oxide.

The value Q being at least 20 means not only that [MgO]/[CaO] is made high but also that in the composition the total content of CaO and $Na_2O$ is made to be substantially larger than the content of $Al_2O_3$. By making the total content of CaO and $Na_2O$ to be larger than the content of $Al_2O_3$, iron present at the time of melting the glass is likely to be present as trivalent iron, and Redox can be controlled to be low without addition of an oxidizing agent.

The value Q is at least 20, preferably at least 25. The value Q is preferably at most 400.

The glass plate of the present invention is made preferably of soda lime silica glass having the following composition (I), more preferably of soda lime silica glass having the following composition (IV), further preferably of soda lime silica glass having the following composition (V), most preferably of soda lime silica glass having the following composition (VI). Particularly in the case of the composition (VI), it is possible to improve the transmittance and Te as $Fe_2O_3$ is little, or to improve Te as the absorption peak intensity within a wavelength range of from 1,000 nm to 1,100 nm by divalent iron is lowered, and thus, it is excellent in that light transmission in the visible to near infrared region is high.

(I) As represented by mass percentage based on oxides,
$SiO_2$: from 60 to 75%,
$Al_2O_3$: more than 0%,
$Na_2O$: from 10 to 20%,
MgO: at least 4.5%, and
CaO: from 1 to 10%.

(IV) As represented by mass percentage based on oxides,
$SiO_2$: from 60 to 75%,
$Al_2O_3$: more than 0% and at most 4.5%,
$Na_2O$: from 10 to 20%,
MgO: from 4.5 to 15%,
CaO: from 1 to 10%,
$ZrO_2$: from 0 to 3%,
total iron calculated as $Fe_2O_3$: from 0 to 0.1%,
$CeO_2$: from 0 to 0.1%, and
$Sb_2O_3$: from 0 to 0.5%.

(V) as represented by mass percentage based on oxides,
$SiO_2$: from 60 to 74.5%,
$Al_2O_3$: from 0.5 to 3.5%,
$B_2O_3$: from 0 to 9%,
$Na_2O$: from 10 to 20%,
$K_2O$: from 0 to 5%,
MgO: from 4.5 to 13%,
CaO: from 1 to 10%,
total iron calculated as $Fe_2O_3$: from 0 to 0.1%,
$CeO_2$: from 0 to 0.05%, and
$Sb_2O_3$: from 0 to 0.5%.

(VI) As represented by mass percentage based on oxides,
$SiO_2$: from 60 to 74%,
$Al_2O_3$: from 0.5 to 2.5%,
$B_2O_3$: from 0 to 5%,
$Na_2O$: from 10 to 20%,
$K_2O$: from 0 to 3%,
MgO: from 4.5 to 10%,
CaO: from 1 to 10%,
total iron calculated as $Fe_2O_3$: from 0.005 to 0.06%,
$Sb_2O_3$: from 0 to 0.1%, and
$ZrO_2$: from 0 to 3%.

Now, the respective components of the composition of the glass plate of the present invention will be described.

$SiO_2$ is the main component of the glass.

If the content of $SiO_2$ is less than 60%, the stability of the glass tends to decrease. If the content of $SiO_2$ exceeds 75%, the melting temperature of the glass tends to increase, and melting is likely to be difficult. The content of $SiO_2$ is preferably from 60 to 75%, more preferably from 60 to 74.5%, further preferably from 60 to 74%, as represented by mass percentage based on oxide.

$Al_2O_3$ is a component to improve the weather resistance.

When $Al_2O_3$ is contained, an effect to improve the weather resistance is observed. It is required to be contained, and when it is at least 0.5%, the weather resistance will be good. Depending upon the amounts of other components, the content of $Al_2O_3$ may suitably be increased to adjust the high temperature viscosity thereby to improve the bubble quality. However, if the content of $Al_2O_3$ exceeds 4.5%, the melting property remarkably deteriorates. It is necessary that $Al_2O_3$ is contained, and its content is preferably more than 0% and at most 4.5%, more preferably from 0.5 to 3.5%, further preferably from 0.5 to 2.5%, as represented by mass percentage based on oxide.

$B_2O_3$ is a component to accelerate melting of glass raw material, but if it is added in a large amount to soda lime silica glass, there will be many disadvantages such as formation of ream by its evaporation, erosion of the furnace wall, etc., such being sometimes not suitable for the production.

The content of $B_2O_3$ is preferably at most 1% as represented by mass percentage based on oxide, more preferably not substantially contained. Here, "not substantially contained" means that it may be included in an amount at a level of an impurity.

Further, $B_2O_3$ improves the mechanical properties and weather resistance of the glass and therefore may be contained in a glass substrate.

$Na_2O$ is an essential component to accelerate melting of glass raw material.

If the content of $Na_2O$ exceeds 20%, the weather resistance and stability of the glass tend to deteriorate. If it is less than 10%, melting of the glass tends to be difficult. The content of $Na_2O$ is preferably from 10 to 20% as represented by mass percentage based on oxide.

$K_2O$ is not essential, but is a component to accelerate melting of glass raw material and to adjust the thermal expansion, viscosity, etc.

If the content of $K_2O$ exceeds 5%, the weather resistance and stability of the glass tend to deteriorate. Further, if it exceeds 3%, the batch cost tends to increase. The content of $K_2O$ is preferably from 0 to 5%, more preferably from 0 to 3%, as represented by mass percentage based on oxide.

CaO is a component to accelerate melting of glass raw material or to adjust the viscosity, thermal expansion coefficient, etc., and it is a component to control Redox to be low.

If the content of CaO exceeds 10%, the devitrification temperature tends to increase. The content of CaO is preferably from 1 to 10% as represented by mass percentage based on oxide.

$ZrO_2$ is not essential, but is a component to improve the elastic modulus of the glass.

If the content of $ZrO_2$ exceeds 3%, the melting property of the glass tends to deteriorate. The content of $ZrO_2$ is preferably from 0 to 3% as represented by mass percentage based on oxide.

$Fe_2O_3$ is a coloring component unavoidably included during the production.

The content of total iron calculated as $Fe_2O_3$ is preferably from 0 to 0.1%.

When the content of the total iron calculated as $Fe_2O_3$ is particularly at most 0.06%, deterioration of Tv can be prevented. Particularly, for a glass plate for a solar cell or for a glass plate for a light-collecting mirror, the content of the total iron calculated as $Fe_2O_3$ is preferably at most 0.050%, more preferably at most 0.040%, further preferably at most 0.020%, particularly preferably at most 0.017%, as represented by mass percentage based on oxide.

The content of $Fe_2O_3$ is particularly preferably from 0 to 0.04%, whereby it is possible to obtain a glass plate having higher Tv and Te.

In this specification, the content of the total iron is represented as the amount of $Fe_2O_3$ in accordance with the standard method of analysis. However, the iron present in the glass is not necessarily all present in the form of trivalent iron. Usually, divalent iron is present in the glass. The divalent iron has an absorption peak in the wavelength region from 1,000 nm to 1,100 nm and also has an absorbance at a wavelength shorter than a wavelength of 800 nm, and trivalent iron has an absorption peak in the vicinity of a wavelength of 400 nm. An increase of divalent iron increases the absorption in a near infrared region around the wavelength region from 1,000 nm to 1,100 nm. As represented by Te, this means that Te decreases. Therefore, when attention is drawn to Tv and Te, it is possible to control Tv to be low by controlling the content of the total iron calculated as $Fe_2O_3$ and to control Te to be low by increasing trivalent iron than divalent iron. Accordingly, with a view to preventing deterioration of Tv and Te, it is preferred to reduce the total iron content and to control Redox to be low.

In the glass plate of the present invention, Redox is preferably at most 40%. When Redox is at most 40%, it is possible to prevent deterioration of Te. Redox is more preferably at most 35%.

The glass plate of the present invention may contain $SO_3$ used as a fining agent. The content of total sulfur calculated as $SO_3$ is preferably from 0.02 to 0.5% as represented by mass percentage based on oxide. If the content of total sulfur calculated as $SO_3$ exceeds 0.5%, reboiling is likely to occur in a process of cooling molten glass, whereby the bubble quality is likely to deteriorate. If the content of total sulfur calculated as $SO_3$ is less than 0.02%, a sufficient fining effect may not be obtained. The content of total sulfur calculated as $SO_3$ is more preferably from 0.05 to 0.5%, further preferably from 0.05 to 0.4%, as represented by mass percentage based on oxide.

The glass plate of the present invention may contain $SnO_2$ used as a fining agent. The content of total tin calculated as $SnO_2$ is preferably from 0 to 1% as represented by mass percentage based on oxide.

The glass plate of the present invention may contain $Sb_2O_3$ used as a fining agent. The content of total antimony calculated as $Sb_2O_3$ is preferably from 0 to 0.5%. If the content of total antimony calculated as $Sb_2O_3$ exceeds 0.5%, the glass plate after forming is likely to be turbid. The content of total antimony calculated as $Sb_2O_3$ is preferably from 0 to 0.1% as represented by mass percentage based on oxide.

It is preferred that the glass plate of the present invention does not substantially contain $TiO_2$, CoO, $Cr_2O_3$, $V_2O_5$ or MnO as a coloring component. Here, "does not substantially contain $TiO_2$, CoO, $Cr_2O_3$, $V_2O_5$ or MnO" means that the glass plate does not contain $TiO_2$, CoO, $Cr_2O_3$, $V_2O_5$ or MnO at all, or may contain $TiO_2$, CoO, $Cr_2O_3$, $V_2O_5$ or MnO as an impurity unavoidably included in the production. When the glass plate does not substantially contain $TiO_2$, CoO, $Cr_2O_3$, $V_2O_5$ or MnO, deterioration of Tv and Te can be prevented. The content of such a coloring component is preferably from 0 to 0.05%.

Te of the glass plate of the present invention (calculated in a thickness of 4 mm) is preferably at least 80%, more preferably at least 82.7%. Te is a solar transmittance calculated by measuring the transmittance by a spectrophotometer in accordance with JIS R3106 (1998) (hereinafter referred to simply as JIS R3106).

Further, in a case where the content of $Fe_2O_3$ as a coloring component in the composition of the glass plate is at most 0.04% as mentioned above, Te (calculated in a thickness of 4 mm) is preferably at least 90%, more preferably at least 91%, further preferably at least 91.5%.

Tv of the glass plate of the present invention (calculated in a thickness of 4 mm) is preferably at least 80%, more preferably at least 82%. Tv is a visible light transmittance calculated by measuring the transmittance by a spectrophotometer in accordance with JIS R3106. As coefficients, values of standard light source A and 2 degree angled configuration are used.

Further, in a case where the content of $Fe_2O_3$ as a coloring component in the composition of the glass plate is at most 0.005% as mentioned above, Tv (calculated in a thickness of 4 mm) is preferably at least 90%, more preferably at least 91%.

The glass plate of the present invention is characterized in that it has a composition capable of preventing deterioration of Te even if divalent iron is present to some extent, for example even if total iron calculated as $Fe_2O_3$ is contained up to 0.1%.

In the glass plate of the present invention, value Tl represented by the following formula (2) is preferably at least 5, more preferably at least 7, further preferably at least 10.

$$Tl=(Te-Te')/[Fe_2O_3] \quad (2)$$

Here, Te is a solar transmittance (calculated in a thickness of 4 mm) as stipulated in JIS R3106 (1998), of the glass plate of the present invention. Te' is a solar transmittance (calculated in a thickness of 4 mm) of common soda lime silica glass which contains the same amount of iron as the glass plate of the present invention and wherein the mass proportion of divalent iron (Redox) calculated as $Fe_2O_3$ in total iron calculated as $Fe_2O_3$ is equal to the glass plate of the present invention, as defined by the following formulae (3) to (5), and $[Fe_2O_3]$ is the amount of total iron as represented by mass percentage based on oxide.

$$Te'=91.62645-12.0867 \times A-323.051 \times B \quad (3)$$

$$A=[Fe_2O_3] \times (100-Re) \times 0.01 \quad (4)$$

$$B=[Fe_2O_3] \times Re \times 0.01 \quad (5)$$

Here, $[Fe_2O_3]$ is the amount of total iron as represented by mass percentage based on oxide, and Re is Redox of the glass as represented by percentage.

The glass plate of the present invention is useful as a glass plate for a solar cell or as a glass plate for a light-collecting mirror. When it is used as a glass plate for a solar cell, it may be used as a cover glass or as a glass substrate for a thin film solar cell.

The glass plate of the present invention may, for example, be produced via the following steps (i) to (v) sequentially.

(i) Glass raw material is prepared by mixing various starting materials for glass matrix composition, cullet, a fining agent, etc. to attain the desired composition.

(ii) The glass raw material is melted to obtain molten glass.

(iii) The molten glass is clarified and then formed into a glass plate having a prescribed thickness by a float process or a downdraw method (a fusion method).

(iv) The glass plate is cooled.

(v) The glass plate is cut into a prescribed size.

Step (i):

The starting materials for glass matrix composition may be ones commonly used as starting materials for usual soda lime silica glass plate, such as silica sand, feldspar, etc.

The fining agent may, for example, be $SO_3$, $SnO_2$, $Sb_2O_3$, etc.

Step (ii):

Melting of the glass raw material is carried out, for example, by continuously supplying the glass raw material into a melting furnace and heating it to about 1,500° C. by heavy oil, gas, electricity, etc.

In the glass plate of the present invention as described in the foregoing, the value Q is at least 20, whereby iron present at the time of melting the glass is likely to be present as trivalent iron, and Redox can be controlled to be low. Accordingly, Te can be made high. Further, MgO is contained in an amount of from 4.5 to 15% as represented by mass percentage based on oxide, and at the same time, [MgO]/[CaO] is made to be larger than 1, whereby it is considered that the proportion of 6-coordination divalent iron having an absorption peak in the wavelength region from 1,000 nm to 1,100 nm decreases and the proportion of divalent iron not having an absorption peak in the wavelength region from 1,000 nm to 1,100 nm increases. Accordingly, it is possible to further increase Te.

As a result, in a case where the iron content is at the same level as in a conventional soda lime silica glass plate, Te can be made to be higher than in the conventional glass plate, or in a case where the iron content is larger than in the conventional glass plate, Te can be made to be at the same level as in the conventional glass plate.

And, even when the iron content in a high transmission glass plate is made relatively large, a high transmission glass plate having sufficiently high Te can be obtained, and accordingly, it is possible to employ glass raw material having a relatively large iron content (i.e. relatively inexpensive glass raw material), and the production cost for the high transmission glass plate becomes low.

Further, even when the temperature of molten glass at the time of producing a high transmission glass plate by a float process or a downdraw method is made to be high at the same level as in the case for producing a usual soda lime silica glass plate by a float process or a downdraw method, and Redox (the proportion of divalent iron) becomes slightly high, the proportion of 6-coordination divalent iron having an absorption peak in the wavelength region from 1,000 nm to 1,100 nm decreases and the proportion of divalent iron not having an absorption peak in the wavelength region from 1,000 nm to 1,100 nm increases. This is considered to be one of the reasons that a high transmission glass plate having sufficiently high Te can be obtained. Thus, a high transmission glass plate can be produced with good productivity.

EXAMPLES

Now, the present invention will be described in detail with reference to Examples, but. it should be understood that the present invention is by no means limited to such specific Examples. Here, the values of Redox, Tv and Te were obtained by the following methods.

(Redox)

The amount of total iron calculated as $Fe_2O_3$ and the amount of divalent iron in the glass were obtained as described below, and Redox was obtained as a mass percentage of divalent iron/total iron, i.e. ($Fe^{2+}/(Fe^{2+}+Fe^{3+})$).

The amount of $Fe_2O_3$ in the glass is the content (%=mass percentage) of total iron calculated as $Fe_2O_3$ obtained by a fluorescent X-ray measurement.

The amount of divalent iron in the glass required for the calculation of Redox is a value quantified by a wet-system analytical method. Specifically, the obtained glass is pulverized, and the glass powder is dissolved in HF and mixed with bipyridyl and an ammonium acetate solution to let it form a color, the absorption peak intensity of which is measured, whereupon based on a calibration curve preliminarily prepared by a standard sample, the amount of divalent iron is quantified.

(Tv)

With respect to the obtained glass plate, the visible light transmittance (Tv) as stipulated in JIS R3106 (by light source A) was obtained as a value calculated in a thickness of 4 mm.

(Te)

With respect to the obtained glass plate, the solar transmittance (Te) as stipulated in JIS R3106 was obtained as a value calculated in a thickness of 4 mm.

In a case where the glass thickness is different, the value as calculated in a thickness of 4 mm was obtained as follows.

Firstly, the reflectance (% $R_f$) on the front surface of the glass and the reflectance (% $R_b$) on the backside of the glass were, respectively, measured every 1 nm by means of a spectrophotometer (U4100, manufactured by Hitachi High-Technologies Corporation). The values of $R_t$ and $R_b$ were added to a value of the transmittance (% T) measured every 1 nm by means of a spectrophotometer (Lambda 950, manufactured by Perkin Elmer) to calculate the inner transmittance (% $T_{inner}$) of the glass (i.e. $T_{inner}$=% T+% $R_t$+% $R_b$). From this % $T_{inner}$, a value calculated in a thickness of 4 mm (% $T_{4mmt}$) was obtained by the following formula.

$$\% T_{4mmt} = 100 \times 10^{-A \times 0.4} - (\% R_t + \% R_b)$$

$$A = \log_{10}(100/\% T_{inner})/d$$

wherein d is the thickness (mm) of the glass plate.

Examples 1 to 19

Figure 2:
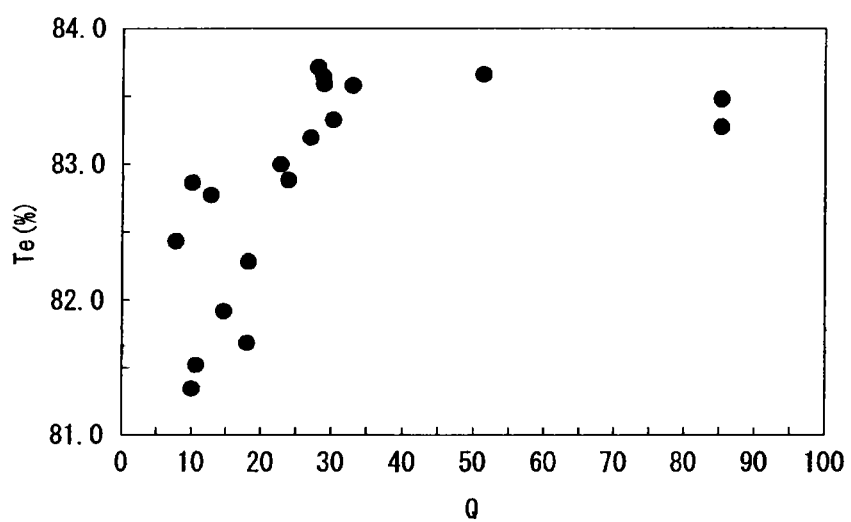
FIG. 2 is a graph showing the relation between the value Q and Te in Examples 1 to 19.

Glass raw material was prepared by mixing various starting materials for glass matrix composition such as silica sand, etc. and a fining agent ($SO_3$) to obtain a composition as shown in Table 1. The glass raw material was put into a crucible and heated in an electric furnace at 1,500° C. for 3 hours to obtain molten glass. The molten glass was cast on a carbon plate and cooled. Both sides were polished to obtain a glass plate having a thickness of 4 mm. With respect to this glass plate, the transmittance was measured every 1 nm by means of a spectrophotometer (Lambda 950, manufactured by Perkin Elmer), and Tv and Te were obtained. The results are shown in Tables 1 and 2 and FIGS. 1 and 2.

TABLE 1

| Composition [%] | Ex. 1 | Ex. 2 | Ex. 3 | Ex. 4 | Ex. 5 |
|---|---|---|---|---|---|
| $SiO_2$ | 72.6 | 71.5 | 66.5 | 67.5 | 61.8 |
| $Al_2O_3$ | 0.0 | 0.0 | 5.2 | 5.3 | 10.2 |
| $Na_2O$ | 11.0 | 14.1 | 16.9 | 10.7 | 16.5 |
| CaO | 2.2 | 3.7 | 1.5 | 4.3 | 3.0 |
| MgO | 14.2 | 10.7 | 9.9 | 12.3 | 8.6 |
| $Fe_2O_3$ | 0.1 | 0.1 | 0.1 | 0.1 | 0.1 |
| Redox [%] | 32 | 26 | 27 | 31 | 33 |
| [MgO]/[CaO] | 6.5 | 2.9 | 6.5 | 2.9 | 2.9 |
| Value Q | 85 | 51 | 85 | 28 | 27 |
| Value TI | 30 | 13 | 13 | 29 | 31 |
| Tv [%] | 89.8 | 89.8 | 89.6 | 89.8 | 89.6 |
| Te [%] | 83.5 | 83.7 | 83.3 | 83.7 | 83.2 |

TABLE 1-continued

| Composition [%] | Ex. 6 | Ex. 7 | Ex. 8 | Ex. 9 | Ex. 10 |
|---|---|---|---|---|---|
| $SiO_2$ | 62.7 | 72.2 | 70.7 | 70.9 | 70.9 |
| $Al_2O_3$ | 10.3 | 0.9 | 1.3 | 1.3 | 0.9 |
| $Na_2O$ | 13.6 | 14.9 | 15.9 | 15.9 | 15.9 |
| CaO | 1.8 | 4.8 | 5.7 | 4.8 | 5.8 |
| MgO | 11.6 | 7.3 | 6.4 | 7.1 | 6.5 |
| $Fe_2O_3$ | 0.1 | 0.1 | 0.1 | 0.1 | 0.1 |
| Redox [%] | 29 | | | | |
| [MgO]/[CaO] | 6.5 | 1.5 | 1.1 | 1.5 | 1.1 |
| Value Q | 33 | 28 | 22 | 29 | 24 |
| Value TI | 22 | | | | |
| Tv [%] | 89.6 | 90.0 | 89.8 | 89.8 | 89.7 |
| Te [%] | 83.6 | 83.7 | 83.0 | 83.6 | 82.9 |

Tv and Te are calculated in a thickness of 4 mm.

TABLE 2

| Composition [%] | Ex. 11 | Ex. 12 | Ex. 13 | Ex. 14 | Ex. 15 | Ex. 16 | Ex. 17 | Ex. 18 | Ex. 19 |
|---|---|---|---|---|---|---|---|---|---|
| $SiO_2$ | 71.1 | 69.9 | 65.8 | 61.9 | 71.6 | 71.3 | 70.5 | 73.1 | 73.1 |
| $Al_2O_3$ | 0.9 | 0.0 | 5.2 | 10.2 | 0.9 | 0.9 | 1.3 | 1.7 | 1.7 |
| $Na_2O$ | 15.9 | 17.0 | 13.6 | 10.3 | 14.8 | 14.7 | 15.8 | 13.1 | 13.1 |
| CaO | 4.8 | 7.7 | 9.0 | 10.3 | 7.6 | 9.0 | 6.7 | 8.1 | 8.1 |
| MgO | 7.3 | 5.5 | 6.5 | 7.4 | 5.1 | 4.1 | 5.7 | 4.1 | 4.1 |
| $Fe_2O_3$ | 0.1 | 0.1 | 0.1 | 0.1 | 0.1 | 0.1 | 0.1 | 0.1 | 0.1 |
| Redox [%] | | 29 | 25 | 28 | | | | 30 | 26 |
| [MgO]/[CaO] | 1.5 | 0.7 | 0.7 | 0.7 | 0.7 | 0.5 | 0.8 | 0.5 | 0.5 |
| Value Q | 30 | 18 | 13 | 7 | 15 | 10 | 18 | 10 | 10 |
| Value TI | | 3 | 1 | 7 | | | | 2 | 3 |
| Tv [%] | 89.9 | 89.5 | 89.6 | 89.4 | 89.4 | 89.5 | 89.7 | 89.5 | 89.8 |
| Te [%] | 83.3 | 81.7 | 82.8 | 82.4 | 81.9 | 81.5 | 82.3 | 81.4 | 82.6 |

Tv and Te are calculated in a thickness of 4 mm.

In the Tables, [%] in the composition is represented by mass percentage.

Here, Examples 1 to 11 are Examples of the present invention, and Examples 12 to 19 are Comparative Examples.

It is evident that in spite of the fact that the contents of total iron calculated as $Fe_2O_3$ are the same, Te of a glass plate having a composition wherein [MgO]/[CaO] is larger than 1, and value Q is at least 20, is high as compared with a glass plate having a composition wherein [MgO]/[CaO] is 1 or smaller, or value Q is less than 20.

Examples 20 to 28

For a glass plate having a composition wherein the content of $Fe_2O_3$ was smaller than in Table 1, glass raw material was prepared by mixing various starting materials for glass matrix composition such as silica sand, etc. and a fining agent ($SO_3$) to obtain a composition as shown in Table 3. The glass raw material was put into a crucible and heated in an electric furnace at 1,500° C. for 3 hours to obtain molten glass. The molten glass was cast on a carbon plate and cooled. Both sides were polished to obtain a high transmission glass plate having a thickness of 4 mm. With respect to the high transmission glass plate, the transmittance was measured every 1 nm by means of a spectrophotometer (Lambda 950, manufactured by Perkin Elmer), and Tv and Te were obtained. The results are shown in Table 3 and FIGS. 3 and 4.

TABLE 3

| Composition [%] | Ex. 20 | Ex. 21 | Ex. 22 | Ex. 23 | Ex. 24 | Ex. 25 | Ex. 26 | EX. 27 | EX. 28 |
|---|---|---|---|---|---|---|---|---|---|
| $SiO_2$ | 72.6 | 71.8 | 69.9 | 71.5 | 62.7 | 72.2 | 73.1 | 72.5 | 72.9 |
| $Al_2O_3$ | 1.80 | 1.73 | 1.80 | 0.06 | 10.3 | 0.90 | 1.70 | 1.0 | 1.1 |
| $Na_2O$ | 15.0 | 14.8 | 15.9 | 14.1 | 13.6 | 14.9 | 13.1 | 14.6 | 14.6 |
| CaO | 1.0 | 4.8 | 4.8 | 3.7 | 1.8 | 4.8 | 8.1 | 2.0 | 0.5 |
| MgO | 9.7 | 6.9 | 7.6 | 10.7 | 11.6 | 7.3 | 4.1 | 9.6 | 10.7 |
| $Fe_2O_3$ | 0.01 | 0.01 | 0.01 | 0.01 | 0.01 | 0.01 | 0.01 | 0.01 | 0.01 |
| Redox [%] | | | | | | | 15 | | |
| [MgO]/[CaO] | 10.1 | 1.4 | 1.6 | 2.9 | 6.5 | 1.5 | 0.5 | 4.7 | 21 |
| Value Q | 143 | 26 | 30 | 51 | 33 | 28 | 10 | 73 | 299 |
| Value TI | | | | | | | | | |
| Tv [%] | 91.9 | 91.8 | 91.8 | 91.9 | 91.8 | 91.8 | | 91.9 | 92.1 |
| Te [%] | 91.6 | 91.6 | 91.6 | 91.5 | 91.5 | 91.6 | 91.3 | 91.6 | 91.8 |

Tv and Te are calculated in a thickness of 4 mm.

In the Table, [%] in the composition is represented by mass percentage.

Here, Examples 20 to 25, 27 and 28 are Examples of the present invention, and Example 26 is a Comparative Example.

It is evident that in spite of the fact that the contents of total iron calculated as $Fe_2O_3$ are the same, Te of a glass plate having a composition wherein [MgO]/[CaO] is larger than 1, and value Q is at least 20, is high as compared with a glass plate having a composition wherein [MgO]/[CaO] is 1 or smaller, or value Q is less than 20.

Figure 3:
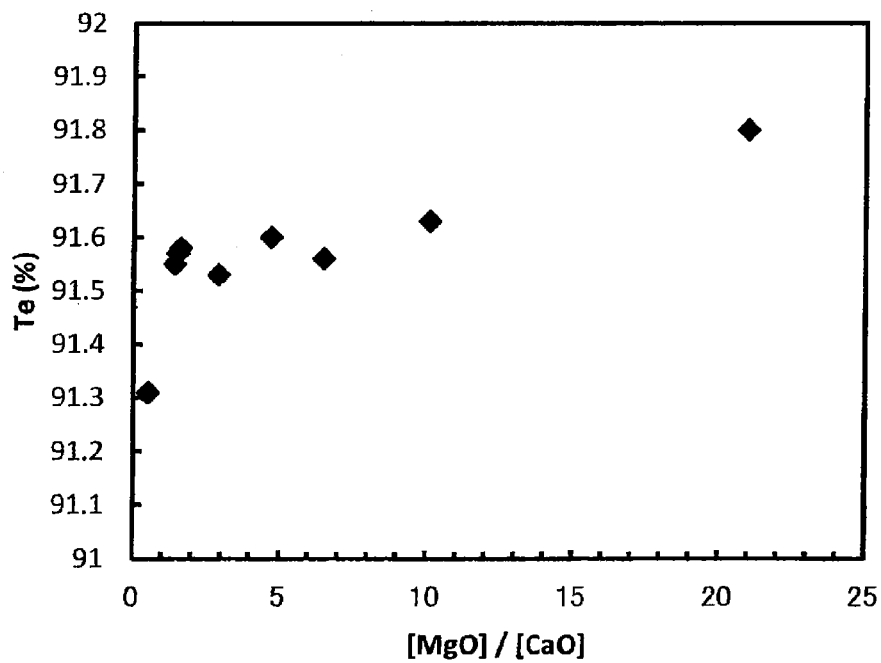
FIG. 3 is a graph showing the relation between [MgO]/[CaO] and Te in Examples 20 to 28.
Figure 4:
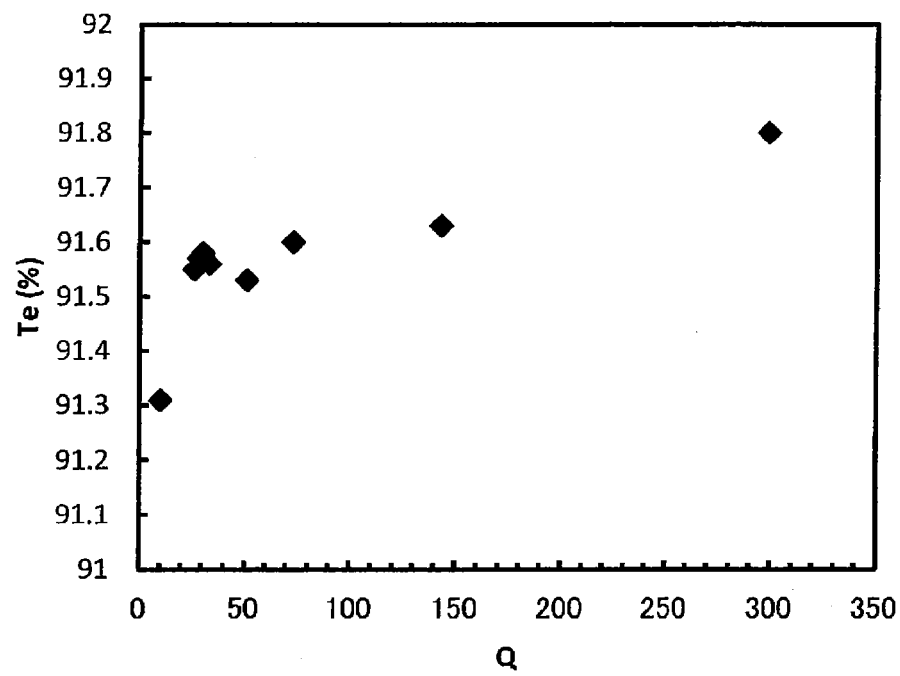
FIG. 4 is a graph showing the relation between the value Q and Te in Examples 20 to 28.

Further, from FIGS. 3 and 4, it is evident that Te in Example 26 is 91.3% but is low as compared with Te (91.5 to 91.8%) in Examples 20 to 25, 27 and 28. In Examples 20 to 28, $Fe_2O_3$ is as low as 0.01%, whereby as compared with Examples 1 to 19, Te tends to be high, but it is evident that in Examples 20 to 25, 27 and 28, Te is further higher than in Example 26.

In the above Tables 1 to 3, a blank space means "not measured" or "not calculated".

INDUSTRIAL APPLICABILITY

According to the present invention, even in the case of a glass plate having a glass composition wherein the iron content is the same level as in a usual soda lime silica glass plate, it is possible to obtain a glass plate having high Te at the same level as a conventional high transmission glass plate having the iron content reduced. Further, in the glass plate of the present invention, when the iron content is reduced, it is possible to obtain a glass plate having further higher Te. Thus, from inexpensive glass raw material containing iron at the same level as a conventional glass plate, it is possible to produce a glass plate having higher Te than the conventional glass plate, thereby to reduce the production cost and improve the productivity, or from glass material having a lower content of iron than a conventional glass plate, it is possible to efficiently produce a glass plate having very high Te.

The glass plate of the present invention is useful as a glass plate for a solar cell (such as a cover glass or a glass substrate for a thin-film solar cell) or as a glass plate for a light-collecting mirror in solar thermal power generation.

This application is a continuation of PCT Application No. PCT/JP2011/074724, filed on Oct. 26, 2011, which is based upon and claims the benefit of priority from Japanese Patent Application No. 2010-240978 filed on Oct. 27, 2010. The contents of those applications are incorporated herein by reference in its entirety.

What is claimed is:

1. A glass plate, comprising:
   soda lime silica glass that comprises MgO, CaO, $Na_2O$, and $Al_2O_3$,
   wherein the glass plate is obtained by a float process or a downdraw method,
   a content of MgO in the glass plate is at least 4.5% by mass percentage based on oxide,
   a content of $Na_2O$ in the glass plate is from 10 to 20% by mass percentage based on oxide,
   a ratio of the content of MgO by mass percentage based on oxide, to a content of CaO by mass percentage based on oxide, ([MgO]/[CaO]), is larger than 1,
   a value Q obtained by formula (1) is at least 20:

$$Q=([MgO]/[CaO])\times([CaO]+[Na_2O]-[Al_2O_3]) \qquad (1),$$

[MgO] is the content of MgO by mass percentage based on oxide,
   [CaO] is the content of CaO by mass percentage based on oxide,
   [$Na_2O$] is a content of $Na_2O$ by mass percentage based on oxide,
   [$Al_2O_3$] is a content of $Al_2O_3$ by mass percentage based on oxide, and
   a content of $B_2O_3$ if present by mass percentage based on oxide is at most 1%.

2. The glass plate according to claim 1,
   wherein the ratio of the content of MgO by mass percentage based on oxide, to the content of CaO by mass percentage based on oxide, ([MgO]/[CaO]), is larger than 1 and not larger than 30, and
   the value Q obtained by formula (1) is at least 20 and at most 400.

3. The glass plate according to claim 1, which comprises by mass percentage based on oxides,
   $SiO_2$: from 60 to 75%,
   $Al_2O_3$: more than 0%,
   $Na_2O$: from 10 to 20%,
   MgO: at least 4.5%, and
   CaO: from 1 to 10%.

4. The glass plate according to claim 1, which comprises by mass percentage based on oxides,
   $SiO_2$: from 60 to 75%,
   $Al_2O_3$: more than 0% and at most 4.5%,
   $Na_2O$: from 10 to 20%,
   MgO: from 4.5 to 15%,
   CaO: from 1 to 10%, and
   total iron calculated as $Fe_2O_3$: from 0 to 0.1%.

5. The glass plate according to claim 1, which comprises by mass percentage based on oxides,
SiO$_2$: from 60 to 75%,
Al$_2$O$_3$: more than 0% and at most 4.5%,
Na$_2$O: from 10 to 20%,
K$_2$O: from 0 to 5%,
MgO: from 4.5 to 10%,
CaO: from 1 to 10%, and
total iron calculated as Fe$_2$O$_3$: from 0 to 0.1%.

6. The glass plate according to claim 1, which comprises by mass percentage based on oxides,
SiO$_2$: from 60 to 75%,
Al$_2$O$_3$: more than 0% and at most 4.5%,
Na$_2$O: from 10 to 20%,
MgO: from 4.5 to 15%,
CaO: from 1 to 10%, ZrO$_2$: from 0 to 3%,
total iron calculated as Fe$_2$O$_3$: from 0 to 0.1%,
CeO$_2$: from 0 to 0.1%, and
Sb$_2$O$_3$: from 0 to 0.5%.

7. The glass plate according to claim 1, which comprises by mass percentage based on oxides,
SiO$_2$: from 60 to 74.5%,
Al$_2$O$_3$: from 0.5 to 3.5%,
Na$_2$O: from 10 to 20%,
K$_2$O: from 0 to 5%,
MgO: from 4.5 to 13%,
CaO: from 1 to 10%,
total iron calculated as Fe$_2$O$_3$: from 0 to 0.1%,
CeO$_2$: from 0 to 0.05%, and
Sb$_2$O$_3$: from 0 to 0.5%.

8. The glass plate according to claim 1, which comprises by mass percentage based on oxides,
SiO$_2$: from 60 to 74%,
Al$_2$O$_3$: from 0.5 to 2.5%,
Na$_2$O: from 10 to 20%,
K$_2$O: from 0 to 3%,
MgO: from 4.5 to 10%, CaO: from 1 to 10%,
total iron calculated as Fe$_2$O$_3$: from 0.005 to 0.06%.
Sb$_2$O$_3$: from 0 to 0.1%, and
ZrO$_2$: from 0 to 3%,
and which does not substantially contain CeO$_2$.

9. The glass plate according to claim 1, wherein as calculated in a thickness of 4 mm of the glass plate, a visible light transmittance (Tv) is at least 80%, and a solar transmittance (Te) is at least 80%.

10. A process for producing a glass plate, the process comprising:
melting glass raw material, followed by
forming the glass plate by a float process or a downdraw method,
wherein the glass plate comprises a soda lime silica glass, which comprises MgO, CaO, Na$_2$O, and Al$_2$O$_3$,
a content of MgO in the glass plate is at least 4.5% by mass percentage based on oxide,
a content of Na$_7$O in the glass plate is from 10 to 20% by mass percentage based on oxide,
a ratio of the content of MgO by mass percentage based on oxide, to a content of CaO by mass percentage based on oxide, ([MgO]/[CaO]), is larger than 1,
a value Q obtained by formula (1) is at least 20:

$$Q=([MgO]/[CaO])\times([CaO]+[Na_2O]-[Al_2O_3]) \quad (1),$$

[MgO] is the content of MgO by mass percentage based on oxide,
[CaO] is the content of CaO by mass percentage based on oxide,
[Na$_2$O] is a content of Na$_2$O by mass percentage based on oxide,
[Al$_2$O$_3$] is a content of Al$_2$O$_3$ by mass percentage based on oxide, and
a content of B$_2$O$_3$ if present by mass percentage based on oxide is at most 1%.

11. The glass plate of claim 1, wherein B$_2$O$_3$ is not present.

12. The glass plate of claim 1, wherein B$_2$O$_3$ is present only as an impurity.

13. The process of claim 10, wherein the glass plate does not comprise B$_2$O$_3$.

14. The process of claim 10, wherein the glass plate comprises B$_2$O$_3$ only as an impurity.

15. The glass plate of claim 1, wherein a content of CaO present in the glass plate is from 1 to 10% by mass percentage based on oxide.

16. The glass plate of claim 1, wherein a content of SiO$_2$ present in the glass plate is at least 71% by mass percentage based on oxide.

17. The glass plate of claim 1, wherein the content of MgO present in the glass plate is at least 6.4% by mass percentage based on oxide.

18. The process of claim 10, wherein a content of CaO present in the glass plate is from 1 to 10% by mass percentage based on oxide.

19. The process of claim 10, wherein a content of SiO$_2$ present in the glass plate is at most 71% by mass percentage based on oxide.

20. The process of claim 10, wherein the content of MgO present in the glass plate is at least 6.4% by mass percentage based on oxide.

* * * * *